(12) United States Patent
Ladiray

(10) Patent No.: US 6,469,556 B2
(45) Date of Patent: Oct. 22, 2002

(54) PULSE-CONTROLLED ANALOG FLIP-FLOP

(75) Inventor: Olivier Ladiray, Montlouis sur Loire (FR)

(73) Assignee: STMicroelectronics S.A., Gentilly (FR)

( * ) Notice: Subject to any disclaimer, the term of this patent is extended or adjusted under 35 U.S.C. 154(b) by 20 days.

(21) Appl. No.: 09/735,407

(22) Filed: Dec. 12, 2000

(65) Prior Publication Data

US 2001/0004193 A1 Jun. 21, 2001

(30) Foreign Application Priority Data

Dec. 14, 1999 (FR) .............................. 99 15773

(51) Int. Cl.[7] ..................... H03K 3/352; H03K 3/335
(52) U.S. Cl. ........................ 327/207; 327/176
(58) Field of Search .................. 327/165, 166, 327/172, 176, 207, 199

(56) References Cited

U.S. PATENT DOCUMENTS

| 3,900,786 A | | 8/1975 | Jordan | 363/23 |
|---|---|---|---|---|
| 4,103,258 A | * | 7/1978 | Iida et al. | 331/111 |
| 4,757,341 A | * | 7/1988 | Tanigawa | 327/463 |
| 5,339,007 A | | 8/1994 | Walton | 315/205 |
| 5,796,599 A | * | 8/1998 | Raonic et al. | 327/441 |
| 5,822,203 A | * | 10/1998 | Peron | 363/125 |

FOREIGN PATENT DOCUMENTS

EP  A-0 551 565  7/1993 ............ H04M/3/30

* cited by examiner

*Primary Examiner*—Timothy P. Callahan
*Assistant Examiner*—Terry Englund
(74) *Attorney, Agent, or Firm*—Wolf, Greenfield, & Sacks, P.CD; James H. Morris

(57) ABSTRACT

A pulse-controlled analog flip-flop includes a charge element; a charge storage element connected to the charge element; an element for detecting the voltage across the storage element; and an element for discharging the storage element when the detection element has detected that the voltage across the storage element has reached a predetermined threshold.

20 Claims, 1 Drawing Sheet

PULSE-CONTROLLED ANALOG FLIP-FLOP

BACKGROUND OF THE INVENTION

The present invention relates to a pulse-controlled analog flip-flop, that is, a circuit having an output state which is one or the other of two voltage states and is controlled by a series of pulses, one or several pulses switching the flip-flop from a first state to a second state and an additional pulse making the flip-flop return from the second state to the first state.

Such a flip-flop can, for example, be used to control the gate of a MOS transistor, the first state corresponding to a voltage level adapted to turn on this MOS transistor and the other state corresponding to a voltage level adapted to turn off (make non-conductive) the MOS transistor.

SUMMARY OF THE INVENTION

An object of the present invention is to provide such a flip-flop which is of particularly simple structure.

Another object of the present invention is to provide such a flip-flop capable of providing high voltage levels.

Another object of the present invention is to provide such a flip-flop which is controllable either by a succession of positive pulses or by a succession of negative pulses.

Another object of the present invention is to provide such a flip-flop which can be simply modified to provide a positive or negative output voltage level.

To achieve these objects as well as others, the present invention provides a pulse-controlled analog flip-flop including a charge means; a charge storage means connected to the charge means; a means for detecting the voltage across the storage means; and a means for discharging the storage means when the detection means has detected that the voltage across the storage means has reached a predetermined threshold.

According to an embodiment of the present invention, the storage means includes a capacitor.

According to an embodiment of the present invention, the discharge means includes a thyristor.

According to an embodiment of the present invention, the detection means includes a Zener diode.

According to an embodiment of the present invention, the charge means includes a capacitor in series with a first diode between a first input terminal and a first terminal of the storage means, and a second diode connected between the connection point of said capacitor and of the first diode and a second supply terminal connected to the second terminal of the storage means.

According to an embodiment of the present invention, the analog flip-flop includes two input terminals; two output terminals; a first storage capacitor connected to the output terminals; a charge circuit, connected between the input terminals and the first capacitor, including a second capacitor connected to an input terminal in series with a first diode connected to the first terminal of the first capacitor, and a second diode connected between the connection point of the second capacitor and of the first diode and the second terminal of the first capacitor, and connected to the second input terminal; a thyristor connected across the capacitor; and a Zener diode connected between the thyristor gate and a terminal representative of the voltage across the capacitor.

According to an embodiment of the present invention, the Zener diode is connected to the connection point between the second capacitor and the first diode.

The foregoing objects, features and advantages of the present invention, will be discussed in detail in the following non-limiting description of specific embodiments in connection with the accompanying drawings.

DETAILED DESCRIPTION

Figure 1:
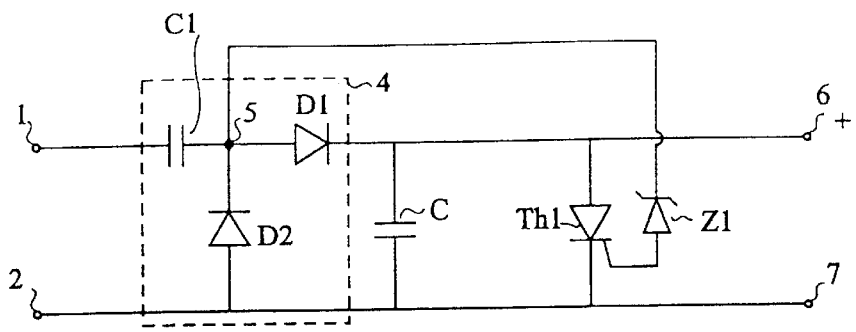
FIG. 1 shows a first embodiment of the present invention.

The circuit of FIG. 1 includes a charge accumulation or voltage storage means shown in the form of a capacitor C. Capacitor C is connected to input terminals 1 and 2 via a charge circuit 4. The output of capacitor C is connected to output terminals 6 and 7. Terminal 7 is directly connected to terminal 2 and forms, for example, a ground terminal. A discharge means formed, for example, of a cathode-gate thyristor Th1 is connected across capacitor C. A means for detecting the voltage across capacitor C is also provided.

In the embodiment shown, charge circuit 4 includes a capacitor C1, a first terminal of which is connected to input terminal 1 and the second terminal of which is connected to the anode of a diode D1. The cathode of diode D1 is connected to the first terminal of capacitor C. Connection point 5 of capacitor C1 and of diode D1 is connected via a diode D2 to second input terminal 2 and to the second terminal of capacitor C, the anode of diode D2 being on the side of second input terminal 2.

In FIG. 1, the detection means is formed of a Zener diode Z1, having its anode connected to the gate terminal of thyristor Th1 and its cathode connected to interconnection point 5.

Figure 2A:
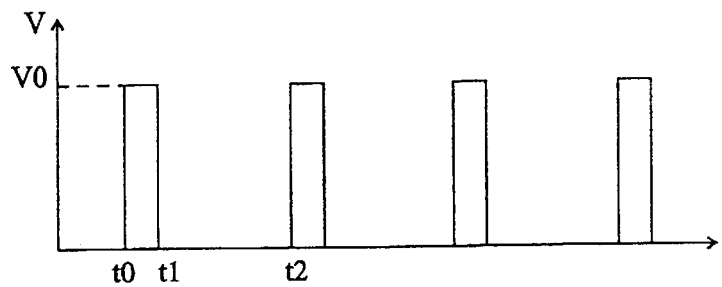
FIG. 2A shows a succession of pulses that can be applied to a flip-flop such as that in FIG. 1.
Figure 2B:
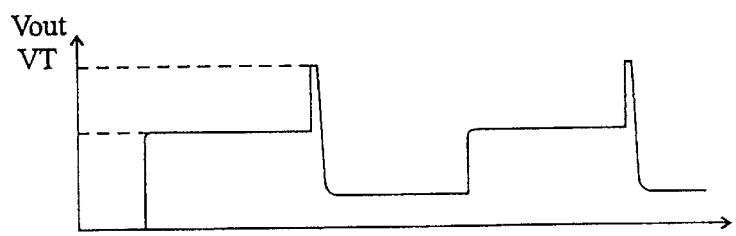
FIG. 2B shows the output voltage of a flip-flop such as that in FIG. 1 receiving the pulses illustrated in FIG. 2A.

The operation of the circuit of FIG. 1 will be described in relation with FIGS. 2A and 2B.

At a time $t_0$ at which the rising edge of a pulse appears between terminals 1 and 2, voltage V0 of this pulse is distributed between capacitors C1 and C. If C1 and C have identical values, and calling Vbe the forward voltage drop of diode D1, voltage VOUT across capacitor C will be:

$$V_{OUT} = \frac{1}{2}(V0 - Vbe).$$

At time $t_1$ when the pulse ends, capacitor C1 discharges through diode D2 while capacitor C remains charged, due to the presence of diode D1.

At the next pulse, at time $t_2$, the charge across capacitor C increases and more specifically tends toward:

$$V_{OUT} = \frac{3}{4}(Vin - Vbe).$$

Thus, in the absence of the detection and discharge circuit, the charge across capacitor C a would tend to increase upon each pulse toward an asymptotic value equal to V0–Vbe. However, when the voltage across capacitor C reaches a threshold voltage VT that depends on avalanche voltage VZ1 of diode Z1 (VT=VZ1–2Vbe, assuming that there is a voltage drop Vbe across diode D2 and a voltage drop Vbe between the thyristor gate and cathode), thyristor Th1 turns on and remains on as long as the current flowing therethrough is greater than its threshold. Thus, capacitor C discharges substantially completely. Threshold voltage VT is preferably chosen as in the example shown so that the thyristor turns on from the second pulse, at time t2. Then, upon each following pulse, it will be alternately switched between a high state and a low state, as shown in FIG. 2B. A pulse-controlled flip-flop has thus been simply obtained.

It should be noted that the above circuit is likely to have many alternatives.

A three-state device can be obtained by choosing the threshold of the Zener diode so that voltage VT is greater than the voltage reached at time $t_2$. Then, at the second pulse, it is switched from a first high state to a second higher high state before falling back to a low state at the third pulse.

Any incremental charge means, other than the specific circuit including elements C1, D1, and D2, may be chosen to accumulate charges in capacitor C upon each occurrence of a pulse. Those skilled in the art may be inspired by various existing charge pump or voltage multiplier circuits.

A current limiting means may be inserted in the switching branch.

The discharge means may be any circuit ensuring the function implemented by thyristor Th1, that is, a switching circuit capable of switching to a conduction state when receiving a pulse and to remain in this conduction state until the current or the voltage thereacross has fallen under a low threshold.

Finally, the means for detecting the voltage across the capacitor may be any means more sophisticated than Zener diode Z1. Further, Zener diode Z1 has been shown as connected to terminal 5 rather than to output terminal 6. A connection to output terminal 6 would also be possible, but this would require using a Zener diode of very good quality having a low leakage resistance, to avoid that capacitor C discharges between two pulses.

It should be noted that the circuit of FIG. 1 may be controlled by a succession of negative pulses as well as by a succession of positive pulses. In the case of negative pulses, capacitor C will charge upon each rising edge of a pulse (the second edge of the pulse) and the switching from one state to the next one will occur at the rising edge of the next pulse (the second edge of this pulse). Thus, as previously, the first pulse (or more exactly, the second edge of this first pulse) sets terminal 6 to a high level and the second pulse sets it back to a low level.

Figure 3:
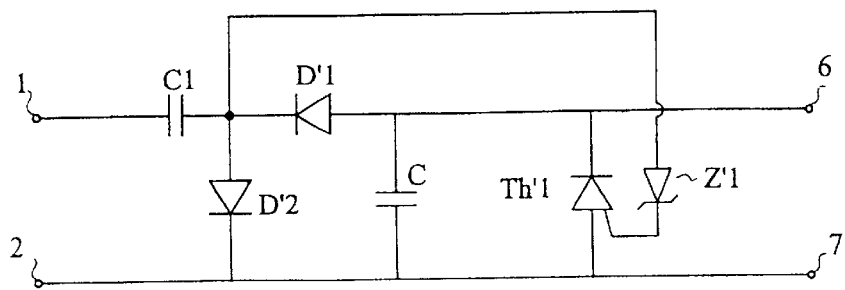
FIG. 3 shows an alternative embodiment of the flip-flop according to the present invention.

FIG. 3 shows an alternative of the circuit of the present invention in which the same elements have been designated with same references. The polarities of diodes D1 and D2, as well as the polarities of the thyristor and of the Zener diode, are inverted with respect to those of FIG. 1. These elements are designated by the same references as in FIG. 1 with a prime. Thyristor Th1' is an anode-gate thyristor. This circuit operates as the preceding one, except that terminal 6 switches, with respect to terminal 7, from a substantially zero value to a negative value.

Thus, the present invention enables controlling any type of MOS transistor or other voltage-controlled component requiring a positive voltage or a negative voltage for its control.

Further, as seen previously, this circuit can be simply controlled by positive or negative pulses.

Another advantage of the flip-flop according to the present invention is that no auxiliary power supply is required for its operation.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A pulse-controlled analog flip-flop including:
   a pulse delivering means;
   a charge means;
   a charge storage means, connected to the charge means, the charge of which increases at each pulse;
   means for detecting a voltage across the charge storage means; and
   means for discharging the charge storage means when the detection means has detected that the charge across the storage means has reached a predetermined threshold, said threshold being greater than a voltage across the charge storage means after applying one pulse to the charge means.

2. The analog flip-flop of claim 1, wherein the storage means includes a capacitor.

3. The analog flip-flop of claim 1, wherein the discharge means includes a thyristor.

4. The analog flip-flop of claim 1, wherein the detection means includes a Zener diode.

5. The analog flip-flop of claim 1, wherein the charge means includes a capacitor in series with a first diode between a first input terminal and a first terminal of the storage means, and a second diode connected between the connection point of said capacitor and of the first diode and a second input terminal connected to a second terminal of the storage means.

6. The analog flip-flop of claim 1, including:
   first and second input terminals; and
   first and second output terminals;
   wherein the charge storage means includes a first capacitor connected to the first and second output terminals;
   wherein the charge means is connected between the input terminals and the first capacitor, and includes a second capacitor connected to the first input terminal in series with a first diode connected to a first terminal of the first capacitor, and a second diode connected between a connection point of the second capacitor and of the first diode and a second terminal of the first capacitor, and connected to the second input terminal;
   wherein the means for discharging the storage means includes a thyristor connected across the first capacitor; and
   wherein the means for detecting the voltage across the storage means includes a Zener diode connected between the thyristor gate and a terminal representative of the voltage across the first capacitor.

7. The analog flip-flop of claim 6, wherein the Zener diode is connected to the connection point between the second capacitor and the first diode.

8. A method for operating a capacitor to form a pulse-controlled analog flip-flop, comprising acts of:
   applying a first voltage pulse to charge the capacitor to a first voltage level;
   applying a second voltage pulse to charge the capacitor to a second voltage level; and
   discharging the capacitor when the second voltage level is greater than or equal to a threshold voltage above the first voltage level.

9. The method of claim 8, further comprising an act of:

using a charge on the capacitor as an output of the pulse-controlled analog flip-flop.

10. A pulse-controlled analog flip-flop, comprising:

a charge circuit having an input to receive a plurality of voltage pulses;

a charge storage device, coupled to the charge circuit, to store a charge in response to the plurality of voltage pulses;

a switch, coupled to the charge storage device, to allow the charge storage device to discharge upon activation of the switch; and a detection circuit, coupled to the switch and the charge circuit, to activate the switch when the charge on the charge storage device exceeds a threshold value.

11. The pulse-controlled analog flip-flop of claim 10, further comprising an output coupled to the charge storage device so that a voltage at the output is a function of the charge on the charge storage device.

12. The pulse-controlled analog flip-flop of claim 10, wherein the charge storage device includes a capacitor.

13. The pulse-controlled analog flip-flop of claim 12, wherein the switch includes a thyristor connected in parallel with the capacitor of the charge storage device.

14. The pulse-controlled analog flip-flop of claim 13, wherein the detection circuit includes a Zener diode coupled to a gate of the thyristor and to the charge circuit to detect the charge on the charge storage device.

15. The pulse-controlled analog flip-flop of claim 14, wherein the charge circuit includes a first diode, coupled to the charge storage device, to prevent the charge storage device from discharging through the charge circuit.

16. The pulse-controlled analog flip-flop of claim 15, wherein the charge circuit further includes a capacitor, coupled to the first diode, to store another charge in response to the plurality of voltage pulses.

17. The pulse-controlled analog flip-flop of claim 10, wherein the threshold value is greater than the charge on the charge storage device after the charge circuit receives a single voltage pulse.

18. A pulse-controlled analog flip-flop, comprising;

a charge circuit having an input to receive a plurality of voltage pulses;

a charge storage device, coupled to the charge circuit, to store a charge in response to the plurality of voltage pulses;

means for discharging the charge storage device when the charge is greater than or equal to a threshold voltage.

19. The pulse-controlled analog flip-flop of claim 18, wherein the threshold voltage is greater than the charge on the charge storage device after the charge circuit receives a single voltage pulse.

20. A pulse-controlled analog flip-flop including:

pulse delivering means for delivering a plurality of pulses;

charge storage means for storing a charge;

charge means for charging the charge storage means so that a charge stored by the charge storage means increases in response to each successive pulse;

detection means for detecting the charge stored by the charge storage means; and discharge means for discharging the charge storage means when the detection means has detected that the charge across the storage means has reached a predetermined threshold, the threshold being greater than the charge across the charge storage means after delivering a single pulse.

* * * * *